US008244677B2

(12) United States Patent
Baron

(10) Patent No.: US 8,244,677 B2
(45) Date of Patent: Aug. 14, 2012

(54) FOCAL POINT COMPRESSION METHOD AND APPARATUS

(76) Inventor: Elad Baron, Cresskill, NJ (US)

( * ) Notice: Subject to any disclaimer, the term of this patent is extended or adjusted under 35 U.S.C. 154(b) by 554 days.

(21) Appl. No.: 12/122,455

(22) Filed: May 16, 2008

(65) Prior Publication Data

US 2008/0215606 A1  Sep. 4, 2008

Related U.S. Application Data

(62) Division of application No. 10/333,492, filed on Jan. 21, 2004, now Pat. No. 7,379,940.

(51) Int. Cl.
  *G06F 15/173*  (2006.01)
  *G06F 17/00*  (2006.01)
  *G06F 17/30*  (2006.01)

(52) U.S. Cl. .......... 707/638; 707/999.006; 707/999.203; 709/247

(58) Field of Classification Search ................ 370/229; 707/814, 999.101, 999.203, 638, 695, 822, 707/999.006; 709/247
  See application file for complete search history.

(56) References Cited

U.S. PATENT DOCUMENTS

| 5,506,580 | A | * | 4/1996 | Whiting et al. | 341/51 |
| 5,850,565 | A | | 12/1998 | Wightman | |
| 6,012,063 | A | | 1/2000 | Bodnar | |
| 6,359,574 | B1 | | 3/2002 | Yariv | |
| 6,704,730 | B2 | | 3/2004 | Moulton et al. | |
| 7,379,940 | B1 | * | 5/2008 | Baron | 1/1 |
| 7,653,079 | B2 | * | 1/2010 | Pessi | 370/412 |
| 7,693,919 | B2 | * | 4/2010 | Joisha | 707/813 |

OTHER PUBLICATIONS

Tridgell, A.; "Efficient Algorithms for Sorting and Synchronization—Thesis"; Apr. 2000.
Chan, M. et al.; "Application of Compaction Technique to Optimizing Wireless Email Transfer"; 1999, IEEE, New Orleans, LA.
Burns, Randal C.; "Differential Compression: a Generalized Solution for Binary Files—Thesis"; Dec. 1996.

* cited by examiner

*Primary Examiner* — Marc Filipczyk
(74) *Attorney, Agent, or Firm* — David I. Roche; Baker & McKenzie LLP

(57) ABSTRACT

A method for compressing and decompressing files is provided. The method includes creating a list of shift-invariant focal points of neighborhoods in the stream and comparing those focal points to a list of focal points created using the same method on the reference stream. The method of the present invention searches for the longest sequence of focal points that appear in both files. The method of the present invention also verifies that neighborhoods contain the same focal points. The changed data and references to the reference stream are then encoded. The decompression process decodes the encoded stream of data, and using the reference stream recreates the new version of stream.

20 Claims, 6 Drawing Sheets

FOCAL POINT COMPRESSION METHOD AND APPARATUS

CROSS-REFERENCE TO RELATED APPLICATIONS

This application is a divisional application of, and claims the benefit of U.S. application Ser. No. 10/333,492 entitled "Focal Point Compression Method and Apparatus" filed Jan. 21, 2004, which is incorporated by reference fully as if set forth herein.

TECHNICAL FIELD OF THE INVENTION

The present invention relates generally to methods and devices associated with file transfer systems that handle periodical updates to repositories of large files, such as World Wide Web ("web") site mirroring systems and database mirroring systems, and more specifically to data compression and decompression.

BACKGROUND OF THE INVENTION

The development of the Internet and the "Global Village" concept has resulted in many distributed computer systems. Frequently, those systems have "core" information repository that can be either a large set of documents, programs, databases, tables in database or even Intranet web sites. Although there are many high-speed communication technologies are available today, it is still usually not practical for all systems in the distributed network to access a central location because failure to reach this location can result in total company information system failure. Moreover, the bandwidth required for such accesses is very large to render such accesses impractical. Many organizations handle this problem by either updating periodically all the branches, or mirroring on periodic basis a central repository to several distributed repositories, thereby achieving some level of fault tolerance. As transferring full repositories requires very large amounts of time due to large sizes of the repositories, many solutions have been developed to speed up this process.

The most common method is compressing the files before shipping them over using common general purpose compression algorithms such as LZ77 or LZ78. These methods, however, rely on the statistical properties of data, and is not suitable for compressing other types of data. For example, LZ77 usually shows very poor performance when handling executables. Another disadvantage associated with existing methods is that if a very small sector of the file is changed, all of the file data typically need to be compressed and resent to a receiving system.

Other methods use the fact that updates usually involve only minor change to the files. The most common of those assumes that the repository contains only text documents, and looks for the lines that have changed and transfers only those lines with additional information regarding where to place them and what other section of the file they replace. The most common example of this is the diff/patch/merge programs used in the UNIX environment. These programs, however, are ill-suited to handle binary data by definition.

Other, less common, systems try to find ways of comparing small fixed portions of the files. These types of systems appear to work only if the changes are made by replacing a section by another section, and requires that the sections have the same length. These systems, however, fail when arbitrary insertions and deletions are involved.

Therefore, it is highly desirable to have a method that can manage to quickly find similar portions of the file regardless of a specific attribute or type of the data such as text, spreadsheet, word processor, and documents. It is also highly desirable to have the method that can quickly differentiate changed portions in any types of files, regardless of the type of changes made to the file.

SUMMARY OF THE INVENTION

The present invention is directed to encoding files to create compressed versions of the files. The compressed files efficiently represent a data stream based on a similar reference stream, i.e., a previous version the file. The method of the present invention divides the data stream or file into a number of neighborhood blocks. The method of the present invention then defines a reference, or a focal point, within a defined neighborhood block. The focal point and accompanying data are then encoded into a data structure. This data structure includes highest byte in the focal point byte sequence, position of the highest byte in the file, CRC of data between the current focal point and the previous focal point length of data between current and previous focal point, and a pointer to the next focal point in the sequence. When the file is modified into a new file (a newer version of the original file), the new file is also encoded as described herein above. To build a compressed version of the new file, the focal point structures of the new file data are then compared with the old data. For example, CRC values of focal points may be compared. The compressed file is then created by inserting at least part of the focal point structure information into the compressed file if the two focal point structures match. If the two focal point structures do not match, raw data is inserted into the compressed file. Using the focal points scheme, the present invention encodes the data stream by replacing parts of data with references to previous version of the data stream. These references are found efficiently by using focal points to speed up the reference lookup.

Further features and advantages of the present invention as well as the structure and operation of various embodiments of the present invention are described in detail below with reference to the accompanying drawings. In the drawings, like reference numbers indicate identical or functionally similar elements.

BRIEF DESCRIPTION OF THE DRAWINGS

Preferred embodiments of the present invention will now be described, by way of example only, with reference to the accompanying drawings in which.

DETAILED DESCRIPTION OF THE INVENTION

Figure 1:
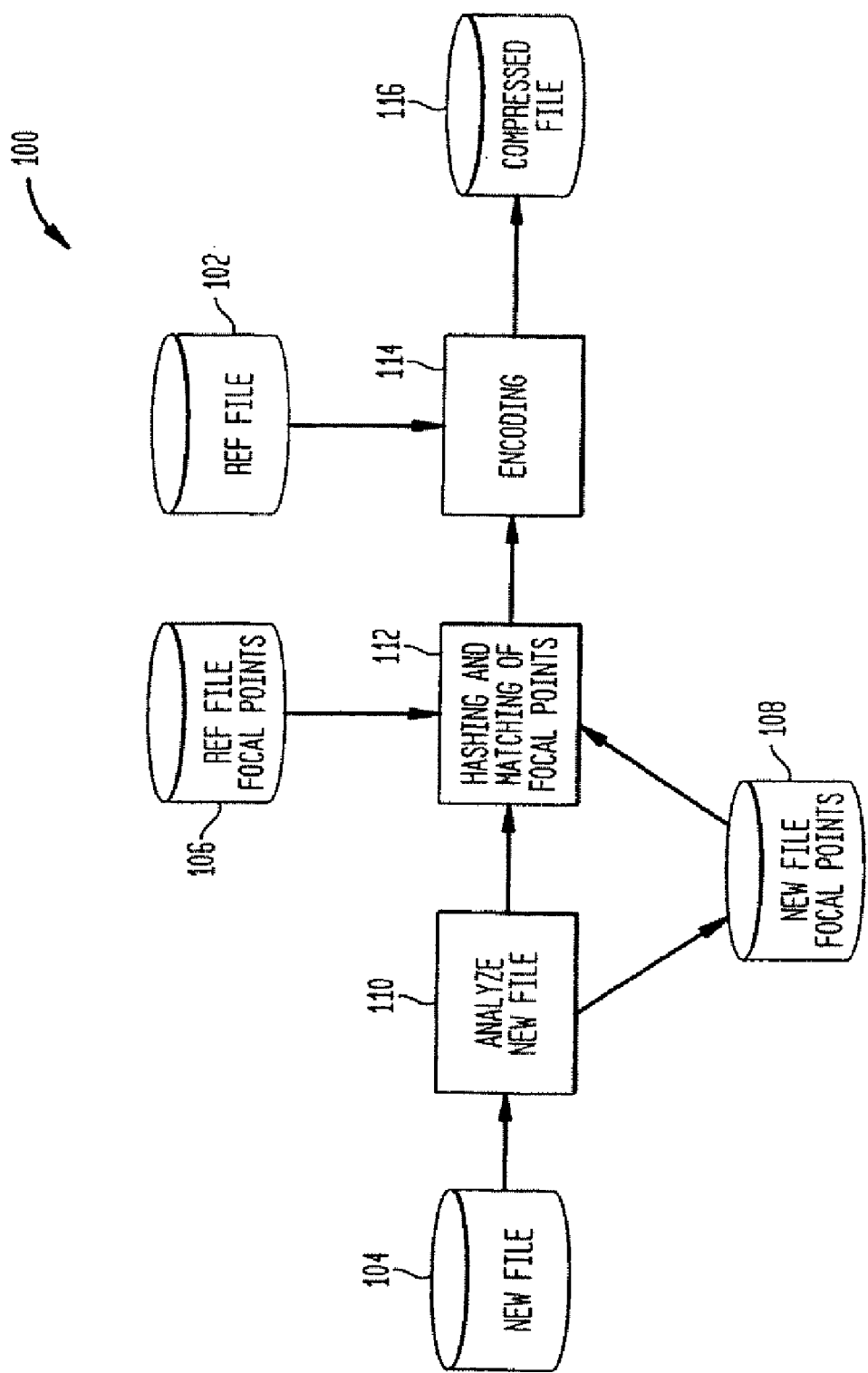
FIG. 1 is a block diagram illustrating an architectural layout of the present invention in one embodiment.

Terminology
Neighborhood

A sequence of bytes in a stream of data not longer than a specified length. For example, if the neighborhood length is defined to be 1000, and byte position starts from 0th byte in a file or data stream, to say that "the word 'Paphiopedilum' appears twice in the neighborhood of position 3000", implies that inside a sequence of bytes not longer than 1000 that contains position 3000, the word 'Paphiopedilum' appears twice.

Focal Point

An identifiable sequence of bytes in the data stream. Focal points of a stream may be defined in many different ways. Graphically, consider looking on a very long picture of landscape with people in it. Focal point can be defined for each neighborhood by choosing the largest groups of people talking to each other in this neighborhood. Those "groups" can be easily seen and they can be used to "pattern" and composition mark their neighborhood.

Focal Point Invariant to Insertion and Deletion ("Invariant Focal Point")

A focal point that is not affected by shift in position caused by inserting or deleting parts of the stream preceding the focal point. For example, in a sequence of ascending bytes that starts in even position, inserting one byte in the beginning of the file invalidates the current focal points and forces a completely new set of focal points to be generated. Focal point may converge again on the original sequence after an insertion or deletion, meaning that deletion or insertion can only change a limited number of focal points in the neighborhoods before and after them. The focal points described from herein are shift invariant in nature.

Reference Stream

A stream that is similar to another stream, probably an older version of the same stream of data. For example, a previous version of a file can be a reference stream to a changed version of the same file. The reference stream exists both during the compression and decompression process.

The present invention defines a reference point or a focal point in a neighborhood or proximity of block of data in a data stream or a file comprising data stream. The data stream or a file compression data stream will from herein be interchangeably referred to as reference stream. The size of the neighborhood may be a fixed or variable predefined value. In the present invention, the data stream of file is divided into bytes of this neighborhood size and a focal point defined for each neighborhood. One focal point exists in a neighborhood. The focal points are represented in a data structure which may include various characteristic of the focal points. The focal point data structure may be stored in a separate volatile or non-volatile storage, e.g., a focal points file, for each data stream of a file. When a file (older version) is modified into a new file (newer version), the differences between the files may be calculated by comparing the focal point data structures of the older version with the newer version. This way, the differences between files may be detected quickly and efficiently. Further the new file may be represented efficiently in a compressed format by including a reference or a pointer to the focal point data structure.

Focal Point Representation and Hashing

A focal point of the present invention may be represented by a structure that includes various characteristics of the focal point in detail that aid in speeding up the matching process. This structure may include a focal point position in a file. The structure may also include a representative value that helps to distinguish it from another focal point. For example, a highest byte value in the focal point sequence may act as this representative value. The structure also may include a pointer to the next focal point in the stream, a hash value of the bytes between current focal point, and the previous focal point in the stream of data. The bytes for computing a hash value for the current focal point structure would include the current focal point byte or bytes and the bytes following a previous focal point up to the current focal point. In one embodiment, a 32 bit Cyclical Redundancy Check (CRC) value is used to as the hash value. The hash value allows for quick determination of whether or not one or more parts of the file are equal.

Matching Focal Point Lookup Process

As the streams in a file can be very large, there is a need for a method of quickly finding matching focal points between the new stream and the reference stream. Further, the number of focal points that are being used to represent a stream can be very large, so it may not be possible to load all of them into the memory. To overcome such a problem, a "sliding window" of focal points in both reference and new stream may be used in one embodiment of the present invention. The window size can be configured according to the system memory size. The windows can also be prevented from going too far from each other by controlling the distance between the position of the window in the reference file and in the newer file. If the distance is too big, the method of the present invention begins sliding the window that was "left behind" and re-synchronizes the windows of the two files.

To match focal points, a hash table is used. In one embodiment, the values used to create the hash may be CRC of the data between the current focal point, the previous focal point, and the length of the focal point sequence. In another embodiment of the present invention, the hash function used may be an exclusive-or ("XOR") between the length of the sequence and the CRC. After finding a match to the start focal point, the method of the present invention quickly follows the next focal point structure and compares more points to look for the length of the matching sequence of focal points.

Focal Point Sequence Identification

In one embodiment of the present invention, to optimize the speed and efficiency of both the compression and decompression of the files, the method of the present invention searches for the longest possible matching sequences.

Focal Point Definition and Analysis

In one embodiment of the present invention, the focal point is defined as a sequence of ascending bytes, the longest in its neighborhood of focal points.

The method of the present invention will now be described in greater detail with reference to the accompanying figures. FIG. 1 is a block diagram 100 illustrating an architectural layout of the present invention in one embodiment. When a file is modified into a different version or a new file 104, the new file 104 is analyzed as shown at 110. The new file 104 is analyzed to define a list of focal points and create a focal points file 108 for this new file. The process of defining and creating focal points file will be described in greater detail herein below with reference to FIG. 2. Referring back to FIG. 1 once the new focal points file 108 is created, the focal points may be compared. As shown at 112, the hash values of focal points of the new file 108 are compared against the bash values of focal points of the old file 106. The focal points file for the old file 106 typically exists from the previous calculations or updates, and thus generally need not be recreated. The comparison or matching process may utilize any known search algorithm such as hash lookup which may be in the order of O(1).

As the comparison is performed, the encoding process shown at 114 takes place. For example, if a match of a focal point hash value is not found, the actual bytes of data encapsulated by the focal point structure is written into the compressed file. The data written into the compressed file would include a tag or a symbol "RAW DATA", the length of data bytes, and the actual bytes of data itself. If a match is found, the compressed file is encoded with "POINTER" tag or symbol, position and length of the data in the reference file 102.

Figure 2:
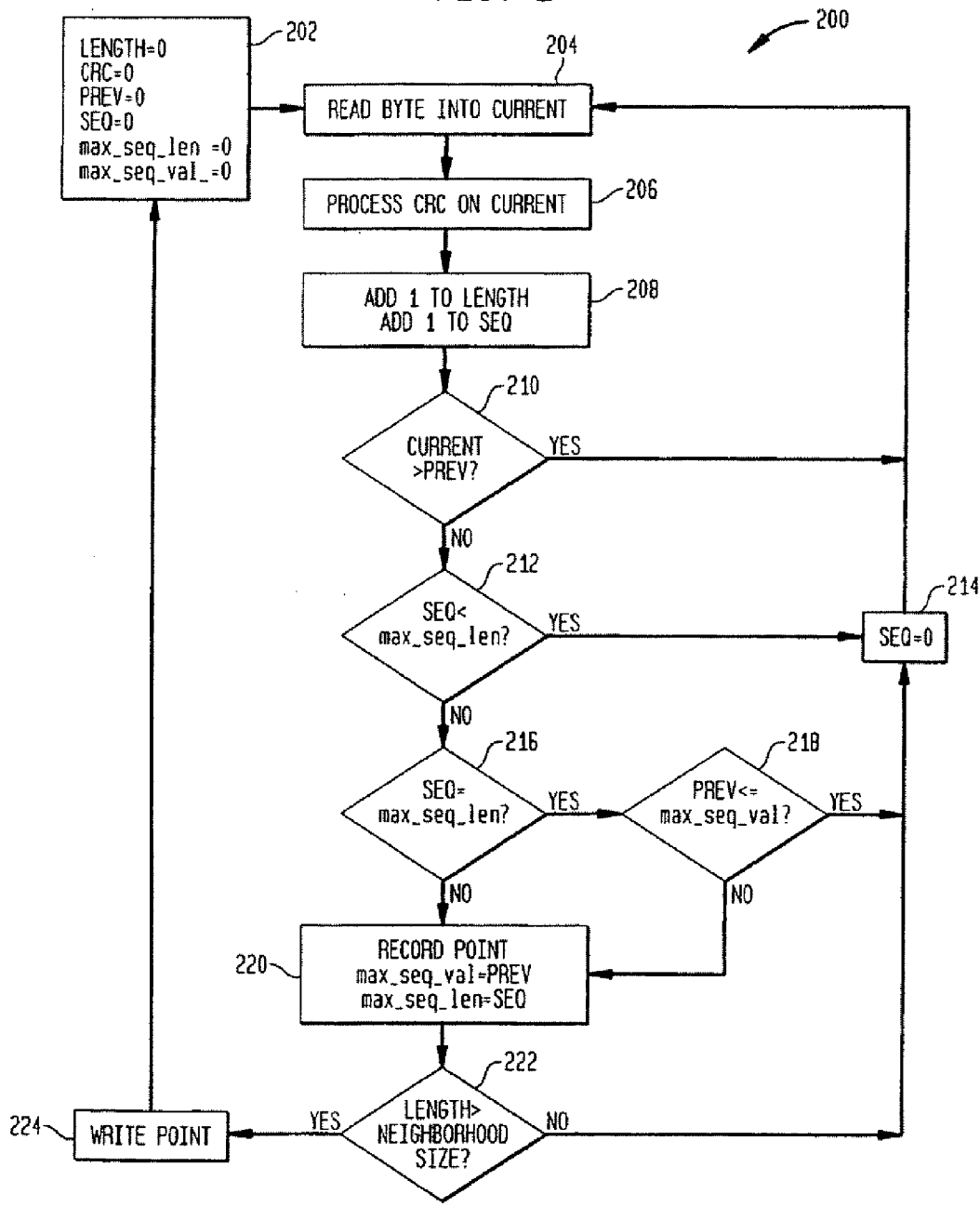
FIG. 2 is a flow diagram illustrating a method for defining focal points in one embodiment.

FIG. 2 is a flow diagram 200 illustrating an exemplary method for defining focal points of the present invention. At step 202, exemplary variables used in the method are initialized and neighborhood value is defined. For example, length is defined as a running total number of bytes read when scanning a neighborhood having predetermined number of data bytes. CRC is the cyclical redundancy checksum value computed for a focal point, and prev represents the value, such as the ASCII number, of the preceding byte. Seq is defined as the length of current ascending sequence of bytes read thus far. Max_seq_len is defined as the byte length of the previous focal point defined in this neighborhood; and max_seq_val is defined as the length of longest focal point sequence previously defined.

To begin the process of defining focal points, a file or stream of data is scanned. At step 204, a byte is read. At step 206, CRC is computed on this byte and added to the checksum value, CRC. At step 208, the values, length and seq are incremented by one to account for the byte read. At step 210, if the value of the current byte read is greater than the previous byte read, the ascending sequence is still valid and the next byte is processed at step 204. If, on the other hand, the current byte value is not greater than the previous byte value, the method of the present invention, at step 212, determines whether the length of the current focal point sequence is less then the length of previously defined focal point sequence in the same neighborhood. If seq, i.e., the length of current focal point sequence, is less than max_seq_len, i.e., the length of longest focal point sequence previously defined, the current focal point sequence is discarded and seq is set to zero at step 214. Then, at step 204 data stream scanning processing continues with next byte being read, in an attempt to define another focal point sequence that may have a length longer than max_seq_len.

If seq was determined to be not less than max_seq_len at step 212, the method of the present invention proceeds to step 216 to determine whether seq, i.e., the length of current focal point sequence is equal to the max_seq_len. If the lengths of current focal point sequence and previously defined focal point sequence is equal, then at step 218, the last byte value in the focal point sequence, i.e., prev, is examined, i.e., prev, is examined. At step 218, if the byte value of the last byte in current focal point sequence is less than the last byte in the previously defined focal point sequence, the current focal point sequence is discarded and seq is set to zero at step 214. Then, at step 204 data stream scanning processing continues with next byte being read in an attempt to define another focal point sequence that may have a length longer than max_seq_len.

If, at step 218, it was determined that the last byte value in the current focal point sequence is greater than the last byte value in the previously defined focal point sequence, the current focal point sequence is set as the candidate focal point sequence for this neighborhood. Thus, at step 220, max_seq_val is set to prev, i.e., the value of the last byte in the current focal point sequence. Similarly, max_seq_len is set to seq, i.e., the length of the current focal point sequence. At step 222, length is compared with the size of neighborhood to determine whether all bytes have been scanned in this neighborhood. If more bytes remain in current neighborhood, seq is set to zero at step 214. Then, at step 204 data stream scanning processing continues with next byte being read in an attempt to define another focal point sequence that may have a length longer than max_seq_len. If at step 222, it was determined that all data have been scanned in current neighborhood, the candidate focal point sequence is written or stored in a focal points file as the focal point for the this neighborhood.

Figure 7:
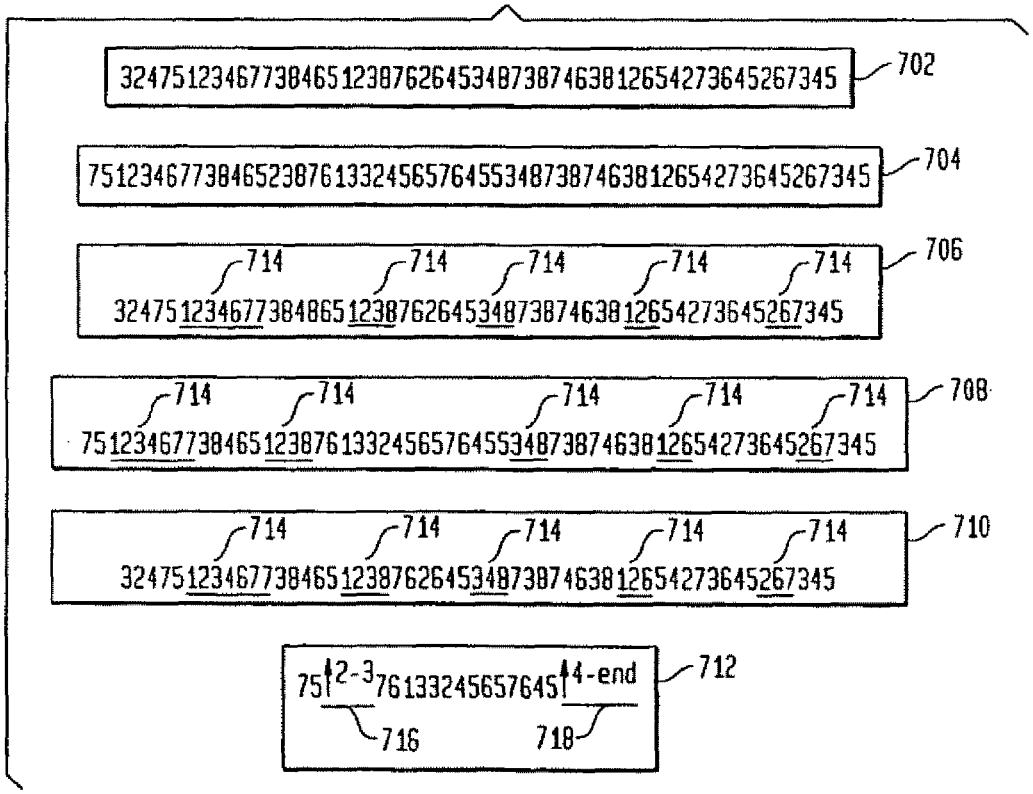
FIG. 7 illustrates exemplary data streams with their focal points defined.

FIG. 7 illustrates two data streams 702, 704 with their focal points 714 defined at 706 and 708 respectively. As shown at 714, each focal point 714 is a longest ascending byte in its neighborhood of size 11. The Data stream at 710 represents reference stream and the data stream shown at 708 represents a modified version of the reference stream. With the method of the present invention, the modified version 708 may be compressed or encoded into a data stream shown at 712. The pointer data at 716 indicates, for example, the data between and including focal points 2 and 3. The pointer data at 718 represents the data between focal point 4 and the end of the stream.

The method thus described with reference to FIG. 2 searches for a focal point candidate that has the longest sequence of ascending bytes in a neighborhood. If there exists more than one sequence of ascending bytes in a neighborhood having the same length, the candidate focal point sequence is determined to be the sequence that has as the last value in the sequence the highest byte value. The process described is performed for each neighborhood of predetermined size. When the entire data stream or a file is scanned, the focal points file would generally include a focal point with an associated data structure for each neighborhood in a data stream or a file. It should be noted that the method of defining focal points and creating focal points file is not limited to the method described above and that other methods also may be employed to define focal points as reference points in a data stream.

The focal points file is typically generated for each file modified. These focal points file can then be used to efficiently determine the differences between the older version of the file (herein interchangeably referred to as a reference file or reference stream) and the modified file or the newer version of the file. Moreover, compressed form of a file may be generated using the focal points file so that when a modified version needs to be communicated to another system, for example, over a network, it would suffice to transmit only the compressed form. The receiver system can then decode or decompress the file and build a mirror image of the modified file.

Figure 3:
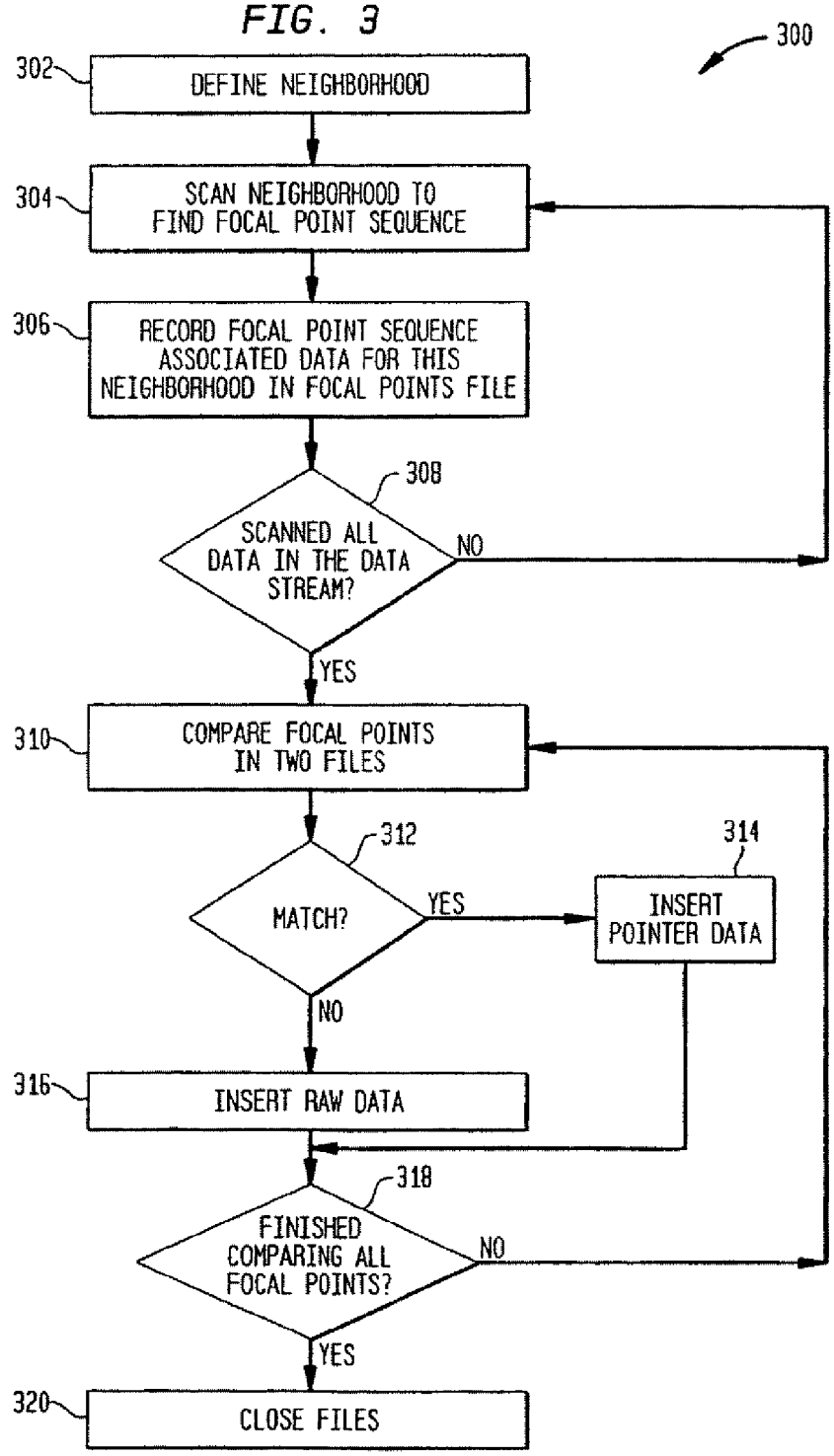
FIG. 3 is a flow diagram illustrating the encoding method of the present invention in one embodiment.

FIG. 3 is a flow diagram 300 illustrating an exemplary encoding method of the present invention. In one embodiment, the focal point is defined as a sequence of ascending bytes, the highest in its neighborhood. A data stream or a file is typically divided into a number of neighborhoods. Neighborhood size may be a fixed sized throughout the data stream or vary from neighborhood to neighborhood in the data stream. At step 302, neighborhood is defined as n-bytes succeeding current position. Focal point type is also defined at step 302. In one embodiment of the invention, focal point is determined to be longest ascending byte sequence having highest byte value. Thus, the scanning and defining focal points processes will search for the longest ascending byte sequence having highest byte value in a given neighborhood, thereby defining a focal point for each neighborhood in a data stream or file. At step 304, data bytes in a neighborhood are scanned using the method described herein above with reference to FIG. 2. When a focal point sequence is found, the method of the present invention records or writes associated information for the focal point for this neighborhood in a focal points file. The information is recorded within a focal point data structure having predefined attributes. These attributes may include the highest byte in the focal point byte sequence, the position of the highest byte in the file, the CRC of the data between this focal point and the previous focal point, the length of data between current and previous focal point and a pointer to the next focal point in the sequence. At step 306, the focal point data structure is written into the focal points file. At step 308, the process continues until the entire data stream or file has been scanned and a focal point for each neighborhood is defined and stored in the focal points file.

At step 310, a compressed file of a new or modified data stream (file) is created. The compressed file is created by first comparing the two focal points files of older and newer versions of data stream (or file). In one embodiment of the present invention, the comparing process comprises comparing the CRC value and length of each focal point sequence associated with a new or modified version of data stream or file to the CRC values and lengths of focal points associated with the older version of the file or data stream. These values were previously included in focal points data structure. At step 312, if a match is found, a "POINTER" tag, data position, and length of data are written to the compressed file at step 314. If at step 312, no match is found, a "RAW DATA" tag, the data bytes, and the length of the data bytes are written into the compressed file at step 316. At step 318, if more focal points need to be compared, the process continues at 310 to compare the next focal point. If, on the other hand, all focal points have been compared the compressed file is closed at step 320.

Figure 4:
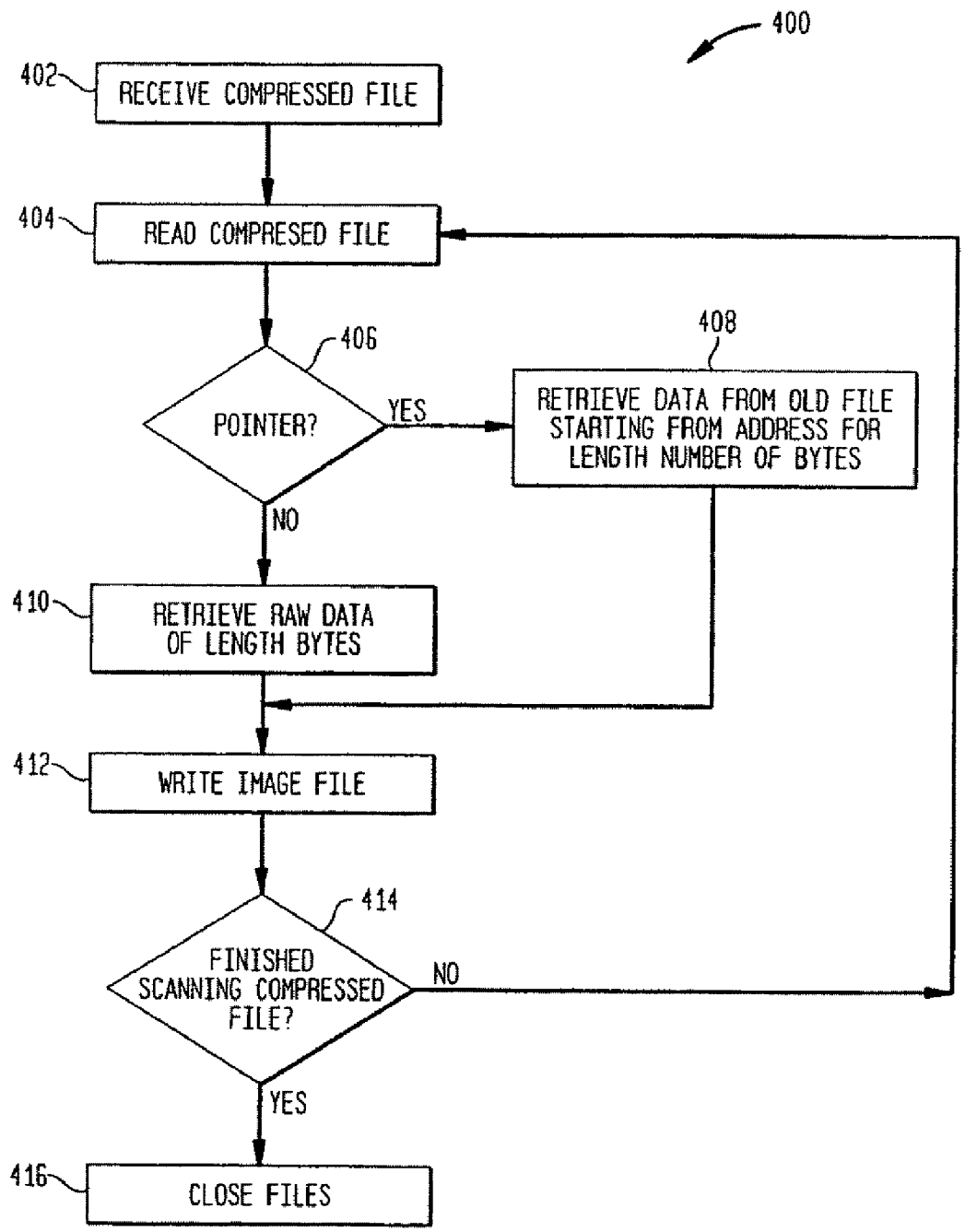
FIG. 4 is a flow diagram illustrating the decoding method of the present invention in one embodiment.

The compressed file may now be used. For example, the compressed file can be transmitted over a network to a mirroring system or a backup system to create the image file in the mirroring system. The mirroring system then can decode or decompress the file to create the same image of the new or modified file existing in the sending system. FIG. 4 is a flow diagram 400 illustrating the decoding method of the present invention in one embodiment. At step 402, the mirroring system receives the compressed file. At step 404, the compressed file is read. At step 406, data read in the compressed file is analyzed. The compressed file includes a tag specifying a type of data, length of data and actual data or a reference to a location of data, depending on the tag type. If a "POINTER" tag is read, it signifies that the data following the tag is the same data existing in the reference file, i.e., the older version of the file. Therefore, at step 408, the decoding method of the present invention refers back to the reference file, retrieving data located at the location specified and length of bytes to retrieve. If, on the other hand at step 206, a "RAW DATA" tag is read, it signifies that this data is new and does not exist in the old file. Therefore, at step 410, a number of bytes following the tag is retrieved from the compressed file. The actual number of bytes to retrieve is specified in a field following the "RAW DATA" tag. The retrieved data, whether from the reference file or the compressed file is then written into an image file at step 412. At step 414, if there are more data which need to be read, the process continues to step 404 to analyze the compressed file and write into image file. If all the data in the compressed file has been analyzed at step 414, the files are closed and the process ends at step 416.

In one embodiment, the methods of the present invention operate on six files. The first file is the new file modified for encoding. The second file is the old file or the reference file. The third file is the focal points file for the reference file. The fourth file is the focal points file for the new file. The fifth file is the compressed file representing the contents of the new file. The sixth file is an image file identical to the new file and created according to the decoding method described herein above with reference to FIG. 4. The third and fourth files are created using the method described herein above with reference to FIG. 2. The fifth file is created with the method described herein above with reference to FIG. 3.

Figure 5:
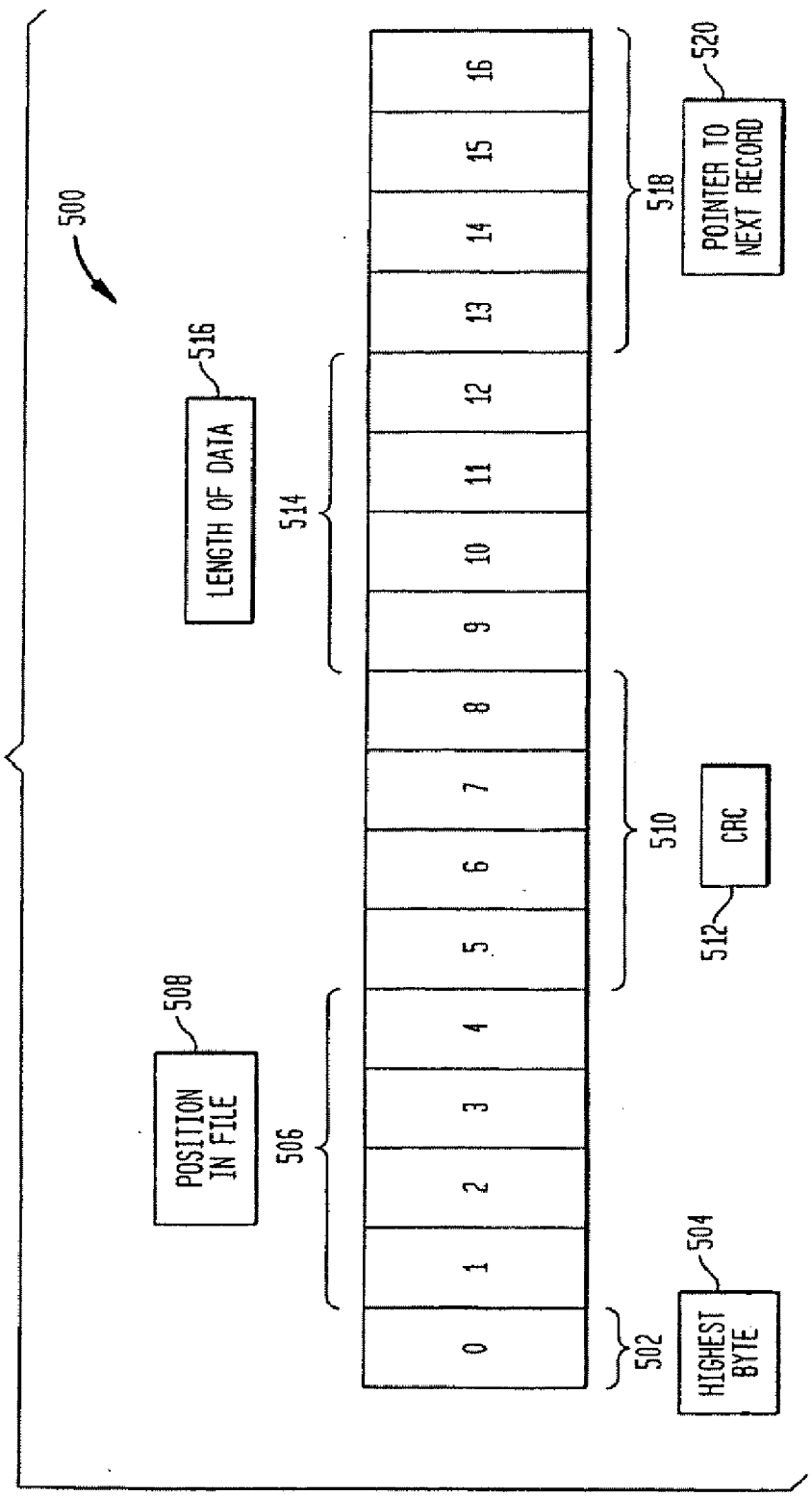
FIG. 5 illustrates an exemplary data structure of the focal point file in one embodiment of the present invention.

FIG. 5 illustrates a data structure 500 of a focal point sequence in an exemplary embodiment. The 0th byte 502 typically includes the highest byte 504 in a focal point sequence. The next four bytes (1st to 4th) 506 represent the position 508 in the data stream or file of the data embodied in the focal point sequence. The next four bytes (5th to 8th) 510 represent the CRC value 512 of the focal point sequence. The next four bytes (9th to 12th) 514 represent the length 516 of data embodied in the focal point sequence. This would include the focal point and any data following the previous focal point. The next four bytes (13th to 16th) 518 represent a pointer 520 to next record of focal point data structure.

Figure 6:
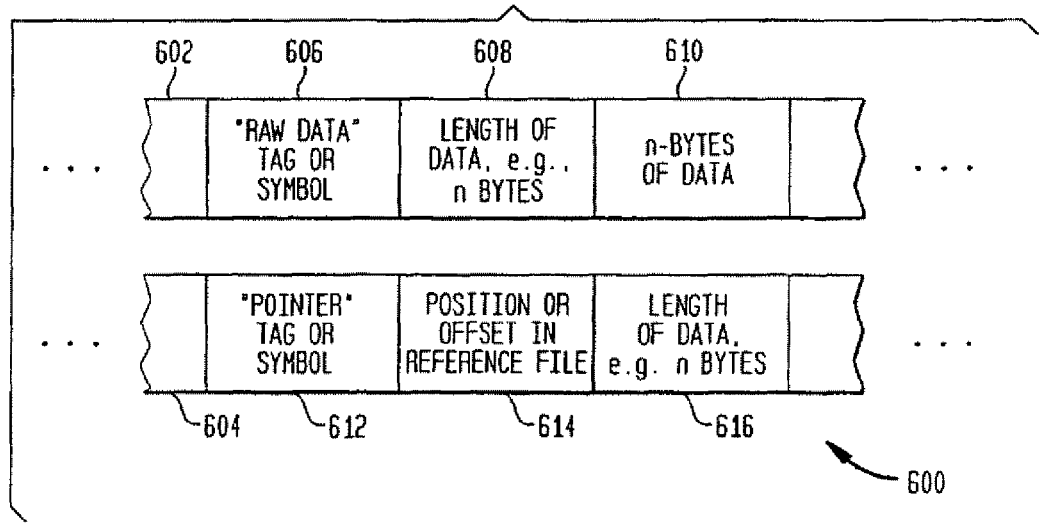
FIG. 6 illustrates an example of a data format in a compressed file in one embodiment of the present invention.

FIG. 6 illustrates an example of a data format 600 in a compressed file in one embodiment of the present invention, the compressed file created from comparing focal point data structures described herein above with reference to FIG. 5. When recording raw data or modified data that is not found in the original reference data stream or file, the data sequence shown at 602 is written in the compressed file. A "RAW DATA" tag 606 signifies that subsequent data following it is actual data. The length of data 608 represents the number of data bytes. This value is followed by length bytes of data 610. The length is typically expressed in number of bytes. The receiving system reading the compressed file will then know how many bytes to read to retrieve the data. This data is then written into an image file representing a mirror image file of the modified file.

When recording existing or unmodified data, that is data found in the original reference data stream or file, the data sequence shown at 604 is written in the compressed file. A "POINTER" tag 612 is followed by the offset in the reference stream or file 614 and the length of data 616 typically expressed in number of bytes. The receiving system analyzing the format will read the reference data stream starting from the offset for length number of bytes to retrieve data. This data is then written into an image file representing a mirror image file of the modified file. The reference stream typically exists on the mirroring system, for example, from the previous update or synchronization sessions. Therefore, only the compressed file may be transmitted for performing updates with the decompression method of the present invention described herein above with reference to FIG. 4.

While the invention has been particularly shown and described with respect to a preferred embodiment thereof it will be understood by those skilled in the art that the foregoing and other changes in form and details may be made therein without departing from the spirit and scope of the invention.

Having thus described our invention, what we claim as new, and desire to secure by Letters Patent is:

1. A method of generating a compressed data stream by using data indicative of a hash value, the method comprising:
receiving over a network incoming data streams, wherein the incoming data streams include a first data stream and a second data stream;
comparing a first identifier associated with a first encoded block of the first data stream with a second identifier associated with a second encoded block of the second data stream, where the first data stream is an older version of the second data stream, wherein each of the first and second data streams includes focal points, wherein a focal point comprises a sequence of at least two ascending bytes;

storing, in the compressed data stream, a reference to the first data stream where data associated with the first encoded block is located if the first and second identifiers are equal; and storing, in the compressed data stream, data associated with the second encoded block of the second data stream if the first and second identifiers are not equal.

2. The method of generating a compressed data stream as claimed in claim 1, wherein the first identifier includes a first hash value computed from data associated with the first encoded block and the second identifier includes a second hash value computed from data associated with the second encoded block.

3. The method of generating a compressed data stream as claimed in claim 2, wherein the first hash value is cyclical redundancy checksum of the data associated with the first encoded block and the second hash value is cyclical redundancy checksum of the data associated with the second encoded block.

4. The method of generating a compressed data stream as claimed in claim 1, wherein the first identifier includes a number of bytes of data associated with the first encoded block and the second identifier includes a number of bytes of data associated with the second encoded block.

5. A method of generating a decompressed data stream from a compressed data stream, the method comprising:

determining whether data in the compressed data stream represents a reference to data of a first data stream or raw data from a second data stream, where the first data stream is an older version of the second data stream, wherein the compressed data stream is generated by using data indicative of a hash value after receiving incoming data streams, wherein the received data streams include focal points, wherein a focal point comprises a sequence of at least two ascending bytes;

if the data represents raw data, storing the raw data in the decompressed data stream; and if the data represents a reference,
accessing a reference data stream at a location within the first data stream specified in the reference;
reading a plurality of bytes located at the location for a number of bytes specified in the reference; and
storing the plurality of bytes from the first data stream in the decompressed data stream.

6. A program storage device readable by machine, tangibly embodying a program of instructions executable by the machine to perform method steps generating a compressed data stream by using data indicative of a hash value, the method steps comprising:

receiving over a network incoming data streams, wherein the incoming data streams include a first data stream and a second data stream;

comparing a first identifier associated with a first encoded block of the first data stream with a second identifier associated with a second encoded block of the second data stream, where the first data stream is an older version of the second data stream, wherein each of the first and second data streams includes focal points, wherein a focal point comprises a sequence of at least two ascending bytes;

storing, in the compressed data stream, a reference to the first data stream where data associated with the first encoded block is located if the first and second identifiers are equal; and storing, in the compressed data stream, data associated with the second encoded block of the second data stream if the first and second identifiers are not equal.

7. The program storage device as claimed in claim 6, wherein the first identifier in the method steps includes a first hash value computed from data associated with the first encoded block and the second identifier includes a second hash value computed from data associated with the second encoded block.

8. The program storage device as claimed in claim 7, wherein the first hash value is cyclical redundancy checksum of the data associated with the first encoded block and the second hash value is cyclical redundancy checksum of the data associated with the second encoded block.

9. The program storage device as claimed in claim 6, wherein the first identifier includes a number of bytes of data associated with the first encoded block and the second identifier includes a number of bytes associated with the second encoded block.

10. A program storage device readable by machine, tangibly embodying a program of instructions executable by the machine to perform method steps of generating a decompressed data stream from a compressed data stream, comprising:

determining whether data in the compressed data stream represents a reference to data of a first data stream or raw data from a second data stream, where the first data stream is an older version of the second data stream, wherein the compressed data stream is generated by using data indicative of a hash value after receiving incoming data streams, wherein the received data streams include focal points, wherein a focal point comprises a sequence of at least two ascending bytes;

if the data represents raw data, storing the raw data in the decompressed data stream; and if the data represents a reference,
accessing a reference stream at a location within the first data stream specified in the reference;
reading a plurality of bytes located at the location for a number of bytes specified in the reference; and
storing the plurality of bytes from the first data stream in the decompressed data stream.

11. A method of generating a compressed data stream by using data indicative of a hash value, the method comprising:

receiving over a network incoming data streams, wherein the incoming data streams include a first data stream and a second data stream;

comparing a first identifier associated with a first encoded block of the first data stream with a second identifier associated with a second encoded block of the second data stream, wherein the first identifier is determined from a first focal point in the first encoded block and wherein the second identifier is determined from a second focal point in the second encoded block, wherein the first focal point comprises a sequence of at least two ascending bytes in the first data stream, and wherein the second focal point comprises a sequence of at least two ascending bytes in the second data stream;

storing, in the compressed data stream, a reference to the first data stream where data associated with the first encoded block is located if the first and second identifiers are equal; and storing, in the compressed data stream, data associated with the second encoded block of the second data stream if the first and second identifiers are not equal.

12. The method of generating a compressed data stream as claimed in claim 11, wherein the first identifier includes a first hash value computed from data associated with the first encoded block and the second identifier includes a second hash value computed from data associated with the second encoded block.

13. The method of generating a compressed data stream as claimed in claim 12, wherein the first hash value is a cyclical redundancy checksum of the data associated with the first encoded block and the second hash value is a cyclical redundancy checksum of the data associated with the second encoded block.

14. The method of generating a compressed data stream as claimed in claim 11, wherein the first identifier includes a number of bytes of data associated with the first encoded block and the second identifier includes a number of bytes of data associated with the second encoded block.

15. The method of generating a compressed data stream as claimed in claim 11, wherein the first focal point is set by determining the longest sequence of bytes with increasing byte content in a predetermined number of bytes, and the second focal point is set by determining the longest sequence of bytes with increasing byte content in a predetermined number of bytes.

16. A program storage device readable by machine, tangibly embodying a program of instructions executable by the machine to perform method steps generating a compressed data stream by using data indicative of a hash value, the method steps comprising:
receiving over a network incoming data streams, wherein the incoming data streams include a first data stream and a second data stream;
comparing a first identifier associated with a first encoded block of a first data stream with a second identifier associated with a second encoded block of a second data stream, wherein the first identifier is determined using a first focal point in the first encoded block and wherein the second identifier is determined using a second focal point in the second encoded block, wherein the first focal point comprises a sequence of at least two ascending bytes in the first data stream, and wherein the second focal point comprises a sequence of at least two ascending bytes in the second data stream;
storing, in the compressed data stream, a reference to the first data stream where data associated with the first encoded block is located if the first and second identifiers are equal; and
storing, in the compressed data stream, data associated with the second encoded block of the second data stream if the first and second identifiers are not equal.

17. The program storage device as claimed in claim 16, wherein the first identifier in the method steps includes a first hash value computed from data associated with the first encoded block and the second identifier includes a second hash value computed from data associated with the second encoded block.

18. The program storage device as claimed in claim 17, wherein the first hash value is a cyclical redundancy checksum of the data associated with the first encoded block and the second hash value is a cyclical redundancy checksum of the data associated with the second encoded block.

19. The program storage device as claimed in claim 16, wherein the first identifier includes a number of bytes of data associated with the first encoded block and the second identifier includes a number of bytes of data associated with the second encoded block.

20. The program storage device as claimed in claim 16, wherein the first focal point is set by determining the longest sequence of bytes with increasing byte content in a predetermined number of bytes, and the second focal point is set by determining the longest sequence of bytes with increasing byte content in a predetermined number of bytes.

* * * * *